United States Patent [19]

Bakos

[11] 4,230,773

[45] Oct. 28, 1980

[54] DECREASING THE POROSITY AND SURFACE ROUGHNESS OF CERAMIC SUBSTRATES

[75] Inventor: Peter Bakos, Endicott, N.Y.

[73] Assignee: International Business Machines Corporation, Armonk, N.Y.

[21] Appl. No.: 966,188

[22] Filed: Dec. 4, 1978

[51] Int. Cl.³ .................... B05D 3/02; B05D 5/12; B32B 9/04; C07F 7/02

[52] U.S. Cl. ........................... 428/447; 260/348.41; 106/104; 106/287.1; 427/96; 427/97; 427/226, 427/387

[58] Field of Search .................. 427/226, 385 C, 387, 427/384, 96, 97; 106/38.3, 38.35, 69; 264/30; 260/348.55, 348.41, 448.2 Q, 448.8 R; 428/540

[56] References Cited

U.S. PATENT DOCUMENTS

| | | | |
|---|---|---|---|
| 3,242,007 | 3/1966 | Jensen | 427/93 |
| 3,243,314 | 3/1966 | Lehman et al. | 427/93 X |
| 3,270,382 | 9/1966 | Emblem et al. | 106/38.35 X |
| 3,292,220 | 12/1966 | Emblem et al. | 106/38.35 X |
| 3,816,163 | 6/1974 | Yoldas | 427/226 |
| 3,819,400 | 6/1974 | Plankl et al. | 427/387 |
| 4,002,800 | 1/1977 | Nestler et al. | 428/540 X |
| 4,128,670 | 12/1978 | Gaensslen | 427/86 |

Primary Examiner—Michael R. Lusignan
Attorney, Agent, or Firm—Pollock, Vande Sande & Priddy

[57] ABSTRACT

The porosity and surface roughness of ceramic substrates are improved by coating the surface with silicon compounds, drying the coated substrate, and then subjecting the substrate to elevated temperature so as to convert the silicon compounds to silicon oxides. Coated substrates obtained by the above process as well as specific preferred organosilane compositions are provided.

32 Claims, No Drawings

DECREASING THE POROSITY AND SURFACE ROUGHNESS OF CERAMIC SUBSTRATES

DESCRIPTION

Technical Field

The present invention is concerned with a method for reducing the porosity and surface roughness of ceramic substrates and is particularly concerned with substrates for integrated circuit modules. The present invention is also concerned with the coated substrates and with certain preferred compositions employed to obtain the improved substrates.

An object of the present invention is to provide for relatively low cost ceramic modules which nevertheless can accommodate high resolution circuitry and which also do not suffer from the problem of degrading at elevated temperatures such as experienced when using polyimides.

Background Art

Ceramics are widely used as substrates for integrated circuit modules. It is known that the results obtained by etching subsequently applied coating such as a metal on the ceramic substrate is greatly influenced by the roughness of the ceramic surface. Because of the variability of a rough ceramic surface such as grain size, porosity, crystallinity, and glassy phase, the etch results can be quite poor. This problem is particularly acute when fine lines or fine resolution circuitry is desired. Although ceramics with increased surface smoothness are commercially available, such are generally relatively expensive.

One particular solution to obtaining a low cost module which can accommodate high resolution circuitry is to employ a coating of a polyimide on the ceramic substrate as discussed in IBM Technical Disclosure Bulletin, Volume 20, No. 8, January 1978 entitled "Use of Polyimide to Obtain a Smooth Surface" by O. R. Abolafia and J. Rasile. However, the use of a polyimide coating for such purposes is not entirely satisfactory since the polyimide will degrade in the event the module is exposed to high temperature. In certain instances, the module must be exposed to high temperature during subsequent processing steps (e.g., about 300°–700° C.). For example, if cermet resistors are to be placed on the module, the module will be subjected to high temperature during the process of applying the cermet resistors.

In order to achieve the above objects, the compositions to be employed must possess a number of crucial properties. For instance, the compositions must be capable of improving the smoothness of a ceramic surface and yet be relatively unaffected by elevated temperatures which would be experienced in subsequent processing steps. The compositions also should be relatively inexpensive so as not to exceed the cost of ceramics now on the market with smooth surfaces. In addition, the materials employed must result in an electrically insulating form remaining with the substrate so as not to affect subsequently applied circuitry, and must form a smooth surface. The material must also provide a strong bond to the ceramic substrate as well as insuring adequate adhesion with subsequently applied coatings such as metal deposits. Also, it is necessary that the composition employed have adequate flow properties so as to flow into the various pores and crevices of the substrate in order to reduce the porosity and roughness of the substrate. The composition employed must also be capable of being maintained within the pores and crevices during subsequent handling or processing of the ceramic substrate. Accordingly, obtaining particular compositions which possess the above desirable properties to the necessary extent is quite difficult.

Disclosure of the Invention

The present invention is directed to a method for reducing the porosity and surface roughness of a ceramic substrate. The method includes applying liquid coating containing at least one nonpolymeric silicon compound to at least one surface of the ceramic substrate. The substrate is then dried and then subjected or exposed to elevated temperature greater than that employed in the drying to convert the at least one silicon compound which is to remain with the substrate to silicon oxides, and to thereby provide a ceramic substrate having reduced porosity and surface roughness.

The present invention is also concerned with ceramic substrates of reduced porosity and reduced surface roughness obtained by the above-described method.

The present invention is also concerned with preferred organosilicon compositions which contain about 5 to about 55% by weight of certain saturated organosilanes and about 45 to about 95% by weight of certain ethylenically unsaturated organosilane compounds. The above weight percents are based upon the total amount of saturated and unsaturated organosilane compounds in the composition.

Best Mode for Carrying Out the Invention

The substrates treated according to the present invention are preferably ceramic substrates. A ceramic is a product or material manufactured by the action of heat on earthy raw materials. The preferred ceramic substrates include silicon oxides and silicates such as aluminum silicate; and aluminum oxides. The ceramic substrates which benefit most by the process of the present invention are those which have surface roughness of at least about 10 microns. Of course, substrates with less surface roughness can be treated according to the present invention. Surface roughness refers to the center line average of the height of any peaks or the depth of any valleys on the surface of the substrate. The present invention finds particular applicability in the preparation of substrates for integrated circuit modules and especially those that require fine resolution circuitry.

A coating containing at least one silicon compound is applied to at least one surface of the ceramic substrate. The silicon compounds employed must be nonpolymeric. The use of polymeric organosilicon compounds is not suitable for the purposes of the present invention of providing smooth surfaces since such upon heating as required in the process of the present invention tend to result in carbonization on the surface of the substrate to too great an extent. The use of polysilicon compounds to impregnate bricks in order to render them less porous and to improve their resistance to molten glass has been suggested such as in U.S. Pat. No. 3,816,163 to Yoldas. The polysilicon compounds, after they impregnate the brick, are subjected to thermal decomposition to silica. However, such compounds since they are polymeric would not be suitable for one of the essential purposes of the present invention of improving the smoothness of the surface in view of the significant tendency of such materials to carbonize.

Other examples of suggestions of employing polymeric or resinous silicon compounds include U.S. Pat. No. 4,041,190 to Dubois et al and U.S. Pat. No. 3,617,341 to Fefferman. U.S. Pat. No. 4,041,190 to Dubois et al suggests forming a silica coating wherein a polysiloxane is subjected to irradiation followed by a heat treatment. U.S. Pat. No. 3,617,341 to Fefferman suggests forming a film by the decomposition of a formulation which can include a silicon resinate.

In addition, it is essential that the coating composition applied to the ceramic substrate be in liquid form and be flowable in order to assure that the silicon compounds properly flow into the pores and the crevices or valleys located on the substrate. The use of organosilicon compounds in vapor form to coat various substrates has been suggested but such a method of application does not adequately fill in the crevices or irregularities on the substrate as required by the present invention. Examples of some disclosures of vapor deposition employing organosilicon compounds are U.S. Pat. No. 3,243,314 to Lehman et al and U.S. Pat. No. 3,242,007 to Jensen. U.S. Pat. No. 3,243,314 to Lehman et al suggests employing vinyl triethoxy silane for thermal decomposition to silicon oxides to form a passivation layer on a semiconductor device. U.S. Pat. No. 3,242,007 to Jensen suggests forming a protective coating on a semiconductor by vapor deposition wherein the siloxane employed can be vinyl triethoxy silane.

A further advantage of applying the composition in liquid form is that the thickness can be accurately controlled as contrasted to vapor deposition. In addition, it is possible to employ very thin coatings which will not plug up holes already present on the ceramic substrate which are used for subsequent pin insertion.

Other prior art which may be of interest is U.S. Pat. No. 3,086,892 to Huntington, which is discussed hereinbelow. Some further prior art which may be of some interest concerning this matter include U.S. Pat. Nos. 2,859,139 to Ramadanoff, 3,547,680 to Bouchard et al., 3,720,542 to Sohlbrand, 3,932,691 to Danzer et al., 3,962,004 to Sonneborn which suggest employing liquid compositions containing a siloxane or silicone which is subsequently decomposed by heat. In addition, U.S. Pat. Nos. 3,055,776 to Stevenson et al., 3,158,495 to Murray et al., 3,523,819 to Tokuyama et al., 3,668,004 to Yamamoto et al., and 4,047,977 to Yoshida et al., may be of interest with respect to the decomposition of silicones at elevated temperatures.

Examples of suitable silicon compounds employed according to the present invention include saturated organosilicon compounds, ethylenically unsaturated organosilicon compounds, and silicon halides such as trichlorosilane and silicon tetrachloride.

The use of liquid organosilanes as the silicon compound in the present invention is preferred. Although, as mentioned above, silicon halides such as trichlorosilane and silicon tetrachloride can be employed, such are not preferred in view of the relatively large percentage of chlorine present in these compounds which, upon decomposition, could result in the diffusion of undesirable amounts of chlorine gas into the substrate. This in turn can cause corrosion and reliability problems in integrated circuits employing the substrates.

It is more preferred, according to the present invention, to employ at least one ethylenically unsaturated organosilicon compound in the coating composition. The ethylenically unsaturated compounds can be mono-ethylenically unsaturated or can include more than one ethylenically unsaturated group. The most preferred compositions employed according to the present invention include at least one saturated organosilicon compound and at least one ethylenically unsaturated organosilicon compound. When a mixture of saturated and unsaturated organosilicon compounds is employed, it is preferred that the compositions contain about 5 to about 55% by weight of the ethylenically unsaturated organosilicon compound and about 45 to about 95% by weight of the saturated organosilicon compound. The above relative percentages are based upon the total of the ethylenically unsaturated and saturated organosilicon compounds in the compositions.

The use of ethylenically unsaturated compounds is preferred according to the present invention since such compounds upon the initial drying step will tend to gel or cross-link somewhat, thereby rendering the composition immobile in the crevices on the substrate to a sufficient extent that the substrates can be handled and/or transported for subsequent treating operations. This aspect is especially important when the substrate being treated is not substantially flat.

In the most preferred aspects of the present invention, mixtures of saturated and unsaturated organosilicon compounds are employed. The presence of the saturated compound in the composition in conjunction with the unsaturated organosilicon compound tends to reduce the tendency for some polymerization of the unsaturated compounds as compared to use of the unsaturated compounds alone. Likewise, the presence of saturated compounds give coatings which have less residue after the decomposition step than when only the unsaturated compounds are employed. Also, the presence of the saturated organosilicon compounds tends to assure that the final product will have a glossy-like finish as contrasted to the presence of some powdery material which could occur when using only the unsaturated organosilicon compounds. Moreover, in many instances, saturated organosilicon compounds are less toxic and less expensive than ethylenically unsaturated silanes.

Generally, saturated (i.e., free from nonbenzoid unsaturation) organosilicon compounds suitable for carrying out the process of the present invention can be represented by the following formula:

$$R'_y SiX_{4-y} \tag{1}$$

wherein $R'_y$ is an organic substituent or mixture of different organic substituents such as alkyl, aryl, alkaryl, cycloalkyl, aralkyl, acyl, alkoxy, and aryloxy. These groups can be unsubstituted or substituted with one or more substituents such as amino, hydroxy, epoxy, or halo radicals. Examples of some suitable alkyl groups are those containing up to about 8 carbon atoms and include methyl, ethyl, propyl, hexyl, and octyl. Examples of some cycloalkyl groups include those containing up to about 6 carbon atoms and include cyclohexyl, cyclobutyl, and cyclopentyl. Examples of some aryl radicals including alkaryl and aralkyl wherein the aryl moiety contains up to 10 carbon atoms include phenyl, methyl phenyl, benzyl, and phenyl ethyl. The alkoxy radicals generally contain up to about 8 carbon atoms, examples of which include methoxy, ethoxy, and propoxy. An example of an aryloxy radical includes benzoxy. When R' is an acyl radical, such generally contains up to about 8 carbon atoms, examples of which include acetyl, propionyl, and butyryl. Examples of some amino substituted hydrocarbon radicals include aminopropyl and aminoethyl. Examples of some hydroxy substituted hydrocarbon groups include hydroxyethyl and hydroxypropyl. Examples of epoxy-substituted hydrocarbon groups include 3,4-epoxy cyclohexyl and glycidoxypropyl. Examples of some halo-substituted radicals include pentachlorophenyl, 1-bromo-3-trichloropropyl and perfluoroalkyl radicals such as gamma-trifluoropropyl and delta-trifluoro-gamma-difluorobutyl. Mixtures of organic radicals can be employed when desired. Y is a whole number integer of 1 to 4. X is hydrogen or a halogen such as a chloro group.

Examples of some suitable saturated organosilicon compounds include ethyltriethoxysilane, amyltriethoxysilane, ethyltrichlorosilane, amyltrichlorosilane, phenyltrichlorosilane, phenyltriethoxysilane, methyltrichlorosilane, methyldichlorosilane, dimethyldichlorosilane, methyltriethoxysilane, dimethyldiethoxysilane, beta-(3,4-epoxycyclohexyl)-ethyltrimethoxysilane, gamma-aminopropyltriethoxysilane, N-bis(beta-hydroxyethyl)-gamma-aminopropyltriethoxysilane, N-beta(aminoethyl)-gamma-aminopropyl-trimethoxysilane and gamma-glycidoxypropyltrimethoxysilane.

The ethylenically unsaturated organosilicon compounds suitable for carrying out the present invention can be represented by the following formula:

$$R_{4-(z+w)}{}^2R'_zSiX_w \qquad (2)$$

wherein z and w individually are whole number integers from 0 to 3 provided that the sum of z+w is 3 or less. R' and X have the same meaning as discussed hereinabove. $R^2$ is an ethylenically unsaturated organic radical and can be monoethylenically unsaturated or polyethylenically unsaturated. Examples of some ethylenically unsaturated radicals include vinyl, allyl, 3-butenyl, acryl, methacryl, oleyl, and linoleyl. Examples of some ethylenically unsaturated organosilicon compounds include vinyl trichlorosilane, vinyl triethoxysilane, vinyltriacetoxysilane, gamma-methacryloxypropyl-trimethoxysilane, methyl vinyl dichlorosilane, and vinyl tris(2-methoxyethoxy)-silane.

Mixtures of saturated organosilicon compounds and/or mixtures of the ethylenically unsaturated organosilicon compounds can be employed when desired.

The silicon compounds are generally applied in combination with a diluent to provide the desired viscosity depending upon the mode of application of the coating composition. Generally, the compositions contain from about 25 to about 90% by weight of a diluent. The diluent should be a low temperature evaporating material which acts as a solvent for the silicon compound but which is substantially nonreactive with the silicon compound and/or with the ceramic substrate. Examples of some suitable organic diluents include alcohols such as methanol, ethanol, and propanol; ketones such as acetone and methyl ethyl ketone; and aromatic diluents such as benzene, toluene, and xylene. The composition can be applied by spraying, spin coating or flow coating techniques.

The compositions can also include other ingredients such as stabilizers which improve the shelf stability of the compositions. One particular stabilizer is piperidene. Such is generally employed in amounts of about 2.5 to about 7%.

Generally, the coating is applied at a wet thickness of up to about 0.1 mm in a single coating step. This is in order to assure the prevention of carbonization of the materials during the subsequent heating operations. If it is necessary to provide thicker films, then multiple coating applications (two or more coating steps) can be carried out after the preceding coating composition has been subjected to the desired drying and decomposition steps.

After the composition is applied, it is subjected to a first heating step. The coated substrate is heated to a temperature below the boiling point of the silicon compound and generally is heated to a temperature of about 50° to about 200° C. This heat treatment is usually carried out until all of the organic inert diluent is removed which usually takes about 30 minutes to about 2 hours.

The coated substrate is then subjected to exposure to elevated temperatures higher than those in the first heating step in order to convert the silicon compounds to silicon oxides. The exact nature of the silicon oxide residue is not definitely ascertained but it is probably not a single substance such as silicon dioxide but rather a mixture of silicon oxides including silicon dioxide and silicon monoxide. Generally, the substrate is subjected to elevated temperatures of about 500° to about 1700° C. and preferably about 700° to about 1300° C. The time required for this heat treatment is generally between about 2 to about 6 hours. The heat treatments can be conducted under ambient or normal atmospheric conditions such as in the presence of air or in an inert atmosphere.

The times and temperatures of the above heating steps are inversely related. For instance, as the temperature of heating increases, the time required for the desired results decreases.

The use of at least two heating steps is important to the successful practice of the present invention. The possibility of contamination of the substrate surface to an unacceptable degree from unwanted residue other than the desired silicon oxides is significantly reduced by first removing the diluent and then providing for the decomposition of the silicon compounds. Use of only a one-stage heating technique would tend to result in carbonization to an unacceptable level. Also, the use of the multiple heating steps insures that the decomposition will result in a glossy rather than a powdery phase. Furthermore, in the preferred embodiments, when an unsaturated organosilicon compound is used, the initial heating provides for some gellation of the unsaturated organosilicon compound which in turn acts to immobilize the silicon compounds to a sufficient degree so as to remain in the pores and crevices of the ceramic.

Ceramic substrates obtained by the above-described process have reduced porosity and reduced roughness along with the presence of a glassy finish obtained from the silicon composition. The coating composition improved the surface roughness by filling in pin holes and the surface imperfections. It has been suggested to coat either a semiconductive wafer or an electrode pellet with a solution of certain organosilicon compounds to form a residue of silicon oxides adhering to the pellet and wafer surface in the preparation of certain junction-type semiconductor devices (e.g., fabricating a rectifying barrier in a semiconductor wafer) as discussed in U.S. Pat. No. 3,086,892 to Huntington. However, the process involved for forming the junction-type semiconductor required in said patent would not result in improving or reducing surface imperfection of the substrates employed therein. The process of said patent requires alloying of the pellet into the wafer during the decomposition of the organosilicon to silicon oxides. The silicon oxides are present so as to prevent excessive spreading of the pellets over the wafer surface during the alloying. However, the finished product will result in a honeycomb like surface due to the alloying requirements therein and will not result in improved surface smoothness as achieved by the present invention.

The process of the present invention finds particular applicability in the preparation of ceramic modules for integrated circuits as discussed hereinabove and particularly for priming or preparing the ceramic surface for subsequent metal deposition thereon. Accordingly, the process of the present invention is especially suitable when the ceramic substrate is subsequently coated with a metal or metals employed in delineating fine line circuitry. One such combination is to apply chromium-copper-chromium circuitry. The circuitry can be fabricated using conventional techniques and high resolution circuitry is readily obtained.

The present invention is particularly applicable in the preparation of ceramic substrates for integrated circuits since the products remaining with the substrate (i.e., silicon oxides) possess electrical insulating properties and are good thermal conductors. Accordingly, such provide for good heat dissipation which is not possessed for instance by the polyimides discussed hereinabove.

The following examples are presented to further illustrate the present invention.

EXAMPLE 1

A composition containing about 1.8 grams of beta(3,4-epoxycyclohexyl) ethyl trimethoxysilane, 0.6 grams of vinyl trichlorosilane, about 1.1 grams aminopropyltrimethoxysilane, about 1.0 grams piperidene, and about 20.5 grams of toluene is applied to a ceramic substrate by dip-coating technique and providing a wet thickness of about 30 microns. The ceramic substrate has a surface roughness or Center Line Average (CLA) of about 28 to about 34 microns. The coated substrate is then placed in an oven and dried for about 90 minutes at about 100° C. The dried coated ceramic substrate is then placed in an oven at ambient atmosphere and exposed to an elevated temperature of about 700° to about 1000° C. for about 4 hours. The ceramic substrate has a surface roughness of only 14 to about 18 microns (CLA) and the resulting decomposition product of the organosilicon composition is a glassy material. It was noted during the coating that the film uniformly flows onto the entire surface of the substrate. The above coating operation is again repeated on the ceramic substrate as well as the above drying and decomposition steps with a resulting ceramic substrate after the second coating operation having a surface roughness of only 5 to 11 microns (CLA).

EXAMPLE 2

Example 1 is repeated except that the composition employed contains about 1.8 grams of beta (3,4-epoxycyclohexyl) ethyl trimethoxysilane, about 1.0 grams of vinyl triethoxysilane, about 0.7 grams vinyl triacetoxysilane, about 1.0 gram piperidene, and about 20.5 grams toluene. The results obtained are similar to those of Example 1.

EXAMPLE 3

Example 1 is repeated except that the coating composition contains about 1.8 grams of beta (3,4-epoxycyclohexyl) ethyl trimethoxysilane, about 1.2 grams vinyl tris (2-methoxyethoxy) silane, about 0.5 grams vinyl triacetoxysilane, about 1.0 gram piperidene, and about 20.5 grams toluene. The results obtained are similar to those of Example 1.

EXAMPLE 4

Example 1 is repeated except that the coating composition contains about 1.8 grams of beta (3,4-epoxycyclohexyl) ethyl trimethoxysilane, about 1.7 grams aminopropyltrimethoxy silane, about 1.0 gram piperidene, and about 20.5 grams toluene. The results obtained are similar to those of Example 1 except that the surface roughness is not reduced to as low a value as achieved in Examples 1-3. This example does not employ any unsaturated silanes; and accordingly, cross-linking and gellation of silane compounds as achieved in Examples 1-3 do not occur. The cross-linking and gellation provide for more uniform and greater coating thickness in Examples 1-3 as compared to this Example 4, which in turn results in thicker silicon oxide layers and better surface improvement after high temperature decomposition.

Having thus described my invention, what I claim as new, and desire to secure by Letters Patent is:

1. A method for reducing the porosity and surface roughness of a ceramic substrate which comprises
   applying a liquid coating composition containing at least one nonpolymeric silicon compound selected from the group of organosilanes, silicon halides, or mixtures thereof to at least one surface of said substrate;
   drying the coated substrate; and
   exposing the dried coated substrate to an elevated temperature higher than that employed in the drying of the coated substrate to thereby convert the nonpolymeric silicon compound to silicon oxides, and thereby obtaining a ceramic substrate having reduced porosity and surface roughness.

2. The method of claim 1 wherein the ceramic substrate is selected from the group of silicon oxides, silicates, and aluminum oxides.

3. The method of claim 1 wherein said ceramic substrate has a surface roughness of at least about 10 microns.

4. The method of claim 1 wherein the silicon compound is selected from the group of saturated organosilicon compounds, ethylenically unsaturated organosilicon compounds, silicon halides, and mixtures thereof.

5. The method of claim 1 wherein said coating composition contains at least one liquid organosilane.

6. The method of claim 1 wherein said coating composition contains at least one ethylenically unsaturated organosilicon compound.

7. The method of claim 1 wherein said coating composition contains at least one ethylenically organosilicon compound and at least one saturated organosilicon compound.

8. The method of claim 1 wherein said coating composition contains about 45 to about 95% by weight of at least one saturated organosilicon compound and about 5 to about 55% by weight of at least one ethylenically unsaturated organosilicon compound, wherein the above percents by weight are based upon the total of the saturated organosilicon compound and unsaturated organosilicon compound in the composition.

9. The method of claim 8 wherein said composition contains beta(3,4-epoxycyclohexyl)ethyl trimethoxysilane and an ethylenically unsaturated organosilicon compound selected from the group of vinyltrichlorosilane, vinyltriethoxysilane, vinyltris (2-methoxyethoxy)silane, vinyltriacetoxysilane, and mixtures thereof.

10. The method of claim 9 wherein said composition further contains aminopropyltrimethoxysilane.

11. The method of claim 1 wherein said coating composition also includes an organic diluent.

12. The method of claim 11 wherein said organic diluent is present in the composition in amounts from about 25 to about 90% by weight wherein the above weight percents are based upon the total of the diluent and silicon compounds present in the composition.

13. The method of claim 1 wherein said coating composition also contains a stabilizer.

14. The method of claim 1 wherein said stabilizer is present in an amount of about 2.5 to about 7% by weight based upon the amount of organosilicon compound, diluent, and stabilizer present in the composition.

15. The method of claim 14 wherein said stabilizer is piperidene.

16. The method of claim 1 wherein said coating composition is applied at a wet thickness of up to about 0.1 mm in a single coating step.

17. The method of claim 1 wherein multiple coating applications are employed.

18. The method of claim 1 wherein the coated substrate is dried at a temperature of about 50° to about 200° C.

19. The method of claim 18 wherein said drying takes about 30 minutes to about 2 hours.

20. The method of claim 1 wherein said elevated temperature is about 500° to about 1700° C.

21. The method of claim 1 wherein said elevated temperature is about 700° to about 1300° C.

22. The method of claim 20 wherein the exposing of the dry coated substrate to said elevated temperature requires about 2 to about 6 hours.

23. The method of claim 1 wherein the exposure to said elevated temperatures is conducted in the presence of air.

24. The method of claim 1 wherein said substrate is a substrate for integrated circuit modules and which further includes subsequently coating the ceramic substrate of reduced porosity and surface roughness with metallic circuitry.

25. A ceramic substrate of reduced porosity and surface roughness obtained by the process of claim 1.

26. The method of claim 11 wherein said organic diluent is present in the composition in an amount of at least about 25% by weight wherein the above weight percents are based upon the total of the diluent and silicon compounds present in the composition.

27. The method of claim 8 wherein said coating composition is applied at a wet thickness of up to about 0.1 mm in a single coating step; said coated substrate is dried at a temperature of about 50° to about 200° C., said elevated temperature is about 700° to about 1300° C., said exposure to elevated temperatures is conducted in the presence of air, and said ceramic substrate has a surface roughness of at about 10 micron.

28. The method of claim 27 wherein said composition contains beta(3,4-epoxycyclohexyl)ethyl trimethoxysilane and an ethylenically unsaturated organosilicon compound selected from the group of vinyltrichlorosilane, vinyltriethoxysilane, vinyltris(2-methoxyethoxy)silane, vinyltriacetoxysilane, and mixtures thereof.

29. The method of claim 28 wherein said composition further contains aminopropyltrimethoxysilane.

30. The method of claim 27 wherein multiple coating applications are employed.

31. The method of claim 27 wherein said substrate is a substrate for integrated circuit modules and which further includes subsequently coating the ceramic substrate of reduced porosity and surface roughness with metallic circuitry.

32. A ceramic substrate of reduced porosity and surface roughness obtained by the process of claim 27.

* * * * *

UNITED STATES PATENT AND TRADEMARK OFFICE
CERTIFICATE OF CORRECTION

PATENT NO. : 4,230,773
DATED : October 28, 1980
INVENTOR(S) : Peter Bakos

It is certified that error appears in the above—identified patent and that said Letters Patent is hereby corrected as shown below:

Column 5, line 28, correct the formula

"$R_{4-(z+w)}{}^2 R'_z SiX_w$", so that it reads

--$R^2{}_{4-(z+w)} R'_z SiX_w$--.

Signed and Sealed this

Sixth Day of October 1981

[SEAL]

Attest:

*Attesting Officer*

GERALD J. MOSSINGHOFF

*Commissioner of Patents and Trademarks*